United States Patent
Thorp et al.

(10) Patent No.: US 7,236,023 B2
(45) Date of Patent: Jun. 26, 2007

(54) APPARATUS AND METHODS FOR ADAPTIVE TRIP POINT DETECTION

(75) Inventors: Tyler J. Thorp, Sunnyvale, CA (US); Mark G. Johnson, Los Altos, CA (US); Brent Haukness, Monte Sereno, CA (US)

(73) Assignee: SanDisk 3D LLC, Milpitas, CA (US)

( * ) Notice: Subject to any disclaimer, the term of this patent is extended or adjusted under 35 U.S.C. 154(b) by 141 days.

(21) Appl. No.: 11/106,288

(22) Filed: Apr. 14, 2005

(65) Prior Publication Data
US 2006/0232304 A1    Oct. 19, 2006

(51) Int. Cl.
*H03L 7/00*    (2006.01)
(52) U.S. Cl. .......................... 327/143; 327/81
(58) Field of Classification Search .......... 827/80, 827/81, 143
See application file for complete search history.

(56) References Cited

U.S. PATENT DOCUMENTS

| | | | | |
|---|---|---|---|---|
| 4,958,898 | A | * | 9/1990 | Friedman et al. ............ 257/350 |
| 6,125,022 | A | * | 9/2000 | Naura .......................... 361/92 |
| 6,137,324 | A | | 10/2000 | Chung et al. ................ 327/143 |
| 7,078,944 | B1 | * | 7/2006 | Jenkins ........................ 327/143 |
| 2004/0263222 | A1 | * | 12/2004 | Tseng et al. ................. 327/143 |
| 2005/0140406 | A1 | * | 6/2005 | Rizzo et al. ................. 327/143 |

* cited by examiner

*Primary Examiner*—Long Nguyen
(74) *Attorney, Agent, or Firm*—James Trosino

(57) ABSTRACT

Apparatus and methods are described for providing an adaptive trip point detector circuit that receives an input signal at an input signal node and generates an output signal at an output signal node, the output signal changing from a first value to a second value when the input signal exceeds a trip point reference value. In particular, the trip point reference value is adjusted to compensate for variations in process or temperature, without requiring an externally-supplied reference signal.

20 Claims, 7 Drawing Sheets

APPARATUS AND METHODS FOR ADAPTIVE TRIP POINT DETECTION

BACKGROUND

Most electronic circuits, such as integrated circuits, receive power from an externally-supplied power supply. For example, an electronic system may include a power supply (e.g., $V_{33}$) that supplies power to one or more integrated circuits included in the system. At system start-up, $V_{33}$ may start at an initial value (e.g., 0 volts), and then gradually increase to its full-scale value (e.g., 3.3 volts). Many integrated circuits, however, include chip configuration circuits or other circuits that require a minimum power supply voltage (e.g., 1.5 volts) for normal operation. If a power supply signal less than the minimum is applied to such configuration circuits, the chip may not operate properly. As a result, many integrated circuits use power-on reset ("POR") circuitry to sense the voltage level of the power supply signal, and generate a control signal that indicates when $V_{33}$ exceeds the minimum power supply voltage.

To accomplish this task, POR circuits typically compare the power supply signal with a reference signal that has a voltage level equal to the minimum power supply voltage, and generate a control signal that indicates when $V_{33}$ is greater than the reference voltage. If the reference signal is an external signal (i.e., off-chip) that is always available, this task is quite straightforward. In most instances, however, an external reference signal is not available, but instead must be generated internally. Previously known POR circuits typically generate such reference signals by using properties of semiconductor devices, such as the threshold voltages of transistors and diodes.

For example, referring now to FIG. 1, a previously known POR circuit is described. POR circuit 10 includes trip detector circuit 12 and filtering circuit 14. Trip detector circuit 12 has an input coupled to $V_{33}$, and generates an output signal $X_{HI}$ that may be used to indicate when $V_{33}$ is greater than an internally-generated trip-point reference signal $V_{REF}$. Filtering circuit 14 smoothes and further processes signal $X_{HI}$, and generates an output control signal $POR_{OUT}$ our that may be used to indicate when power supply signal $V_{33}$ is sufficiently high for normal circuit operation.

Referring now to FIG. 2, an exemplary previously known trip detector circuit 12 is described. Trip detector circuit 12 includes diode-connected p-channel transistor 16 having its source terminal coupled to power supply $V_{33}$, and its drain and gate terminals coupled together at node $V_x$. Node $V_x$ also is coupled to ground via resistor 20, and to the gate of n-channel transistor 18. N-channel transistor 18 has its drain coupled to output node $X_{HI}$, which also is coupled to power supply $V_{33}$ via resistor 22. P-channel transistor 16 has a threshold voltage $V_{TP}$ having a nominal magnitude of about 0.8V, and n-channel transistor 18 has a threshold voltage $V_{TN}$ having a nominal value of about 0.8V. For simplicity, the symbol $V_{TP}$ will be used to refer to the magnitude of the threshold voltage of a p-channel transistor.

Referring now to FIGS. 2 and 3, the operation of exemplary trip detector circuit 12 is described. In particular, FIG. 3 illustrates $V_{33}$, $V_x$ and $X_{HI}$ as a function of time. At t=0, $V_{33}$=0V, transistor 16 is OFF, and no current flows through resistor 20. As a result, $V_x$=0V, transistor 18 is OFF, no current flows through resistor 22, and $X_{HI}$=$V_{33}$=0V. For $0 \leq t < T_1$, $V_{33}$ increases, but remains below $V_{TP}$. As a result, transistor 16 remains OFF, and $V_x$=0. At t=$T_1$, $V_{33}$ exceeds $V_x$ by the threshold voltage $V_{TP}$, and transistor 16 begins to conduct. If resistor 20 is very large, the drain current of transistor 16 is very small, and $V_x$ remains one $V_{TP}$ below $V_{33}$. For $T_1 \leq t < T_2$, the voltage on node $V_x$ increases with increasing $V_{33}$, but remains below the threshold voltage $V_{TN}$ of transistor 18. Accordingly, transistor 18 remains OFF, no current flows through resistor 22, and thus $X_{HI}$=$V_{33}$. At t=$T_2$, $V_x$ is greater than $V_{TN}$, and transistor 18 begins to conduct. If resistor 22 is large, the drain current of transistor 18 is small, and transistor 18 pulls $X_{HI}$ to ground. Thus, $X_{HI}$ changes from a positive non-zero voltage to 0V when $V_{33}$ exceeds trip-point reference signal $V_{REF}$=$V_{TP}$+$V_{TN}$.

Threshold voltages $V_{TP}$ and $V_{TN}$, however, may vary significantly with variations in processing and temperature. For example, over normal process and temperature variations, threshold voltages $V_{TP}$ and $V_{TN}$ may have values between 0.6V to 1.2V. As a result, trip-point reference signal $V_{REF}$ may vary between $V_{REFL}$=1.2V to $V_{REFH}$=2.4V. For some circuit applications, such a wide variation in $V_{REF}$ may be unacceptable. For example, as described above, if a chip configuration circuit requires that $V_{33}$ be at least 1.5V, such a circuit may fail if threshold voltages $V_{TP}$ and $V_{TN}$ are low (e.g., $V_{TN}$=$V_{TP}$=0.6V, and thus $V_{REF}$=1.2V). Likewise, if threshold voltages $V_{TP}$ and $V_{TN}$ are both high (e.g., $V_{TN}$=$V_{TP}$=1.7V, and thus $V_{REF}$=3.4V), $X_{HI}$ may never change state, and thus the POR circuit would fail.

In view of the foregoing, it would be desirable to provide methods and apparatus that reduce the sensitivity of trip point detection circuits to process and temperature variations.

It also would be desirable to provide methods and apparatus that increase the trip point reference $V_{REF}$ of trip point detection circuits when transistor threshold voltages are lowered as a result of process or temperature conditions.

It additionally would be desirable to provide methods and apparatus that decrease the trip point reference $V_{REF}$ of trip point detection circuits when transistor threshold voltages are raised as a result of process or temperature conditions.

SUMMARY

In view of the foregoing, it is an object of this invention to provide methods and apparatus that reduce the sensitivity of trip point detection circuits to process and temperature variations.

It also is an object of this invention to provide methods and apparatus that increase the trip point reference $V_{REF}$ of trip point detection circuits when transistor threshold voltages are lowered as a result of process or temperature conditions.

It additionally is an object of this invention to provide methods and apparatus that decrease the trip point reference $V_{REF}$ of trip point detection circuits when transistor threshold voltages are raised as a result of process or temperature conditions.

These and other objects of this invention are accomplished by providing adaptive trip point detection circuits that adjust the trip point reference signal value to compensate for variations in process or temperature, without requiring an externally-supplied reference signal. In a first exemplary embodiment, a controlled current source is coupled to an internal node of a trip point detection circuit, and the controlled current source conducts a current that varies based on process and temperature conditions. For nominal or slow processes or nominal or low temperature conditions, the trip-point reference signal value equals a sum of two threshold voltages. For fast processes or high temperature conditions, in contrast, the trip-point reference signal value is increased.

In a second exemplary embodiment, a controlled current source is coupled to the output node of a trip point detection circuit, and the controlled current source conducts a current that varies based on process and temperature conditions. For nominal or slow processes or nominal or low temperature conditions, the trip-point reference signal value equals a sum of two threshold voltages. For fast processes or high temperature conditions, in contrast, the trip-point reference signal value is increased.

In a third exemplary embodiment, a first controlled current source is coupled to an internal node of a trip point detection circuit, a second controlled current source is coupled to an output node of the trip point detection circuit, and the first and second controlled current sources conduct currents that vary based on process and temperature conditions. For nominal or slow processes or nominal or low temperature conditions, the trip-point reference signal value equals a sum of two threshold voltages. For fast processes or high temperature conditions, in contrast, the trip-point reference signal value is increased.

In a fourth exemplary embodiment a first transistor having a nominal threshold voltage and a second transistor having a high threshold voltage are coupled to an output node of a trip point detection circuit, and the first and second transistors are switched in or out of the trip point detector circuit based on process and temperature conditions. For nominal or slow processes or nominal or low temperature conditions, the first transistor is switched into the trip point detector circuit. For fast processes or high temperature conditions, in contrast, the second transistor is switched into the trip point detector circuit.

BRIEF DESCRIPTION OF THE DRAWINGS

The above-mentioned objects and features of the present invention can be more clearly understood from the following detailed description considered in conjunction with the following drawings, in which the same reference numerals denote the same elements throughout, and in which.

DETAILED DESCRIPTION

The present invention provides methods and apparatus that reduce the sensitivity of trip point detection circuits to process and temperature variations. In some embodiments, methods and apparatus in accordance with this invention increase the trip point reference $V_{REF}$ when transistor threshold voltages are lowered as a result of process or temperature conditions. In other embodiments, methods and apparatus in accordance with this invention decrease the trip point reference $V_{REF}$ when transistor threshold voltages are raised as a result of process or temperature conditions. As used herein, a semiconductor process is characterized as "nominal," "slow" or "fast," based on the value of transistor threshold voltages produced by the process. In particular, a process is characterized as nominal, slow or fast if the transistors produced by the process have nominal, high or low threshold voltages, respectively.

Persons of ordinary skill in the art will understand that because p-channel and n-channel transistors are produced by different process steps, the threshold voltages of p-channel and n-channel transistors may not necessarily track one another. Thus, wafers produced by a single process may have "slow" p-channel transistors and "fast" n-channel transistors. As a result, methods and apparatus in accordance with this invention may adjust the trip point reference $V_{REF}$ based on detecting process-induced shifts in the threshold voltages of p-channel transistors only, n-channel transistors only, or both p- and n-channel transistors.

Figure 1:
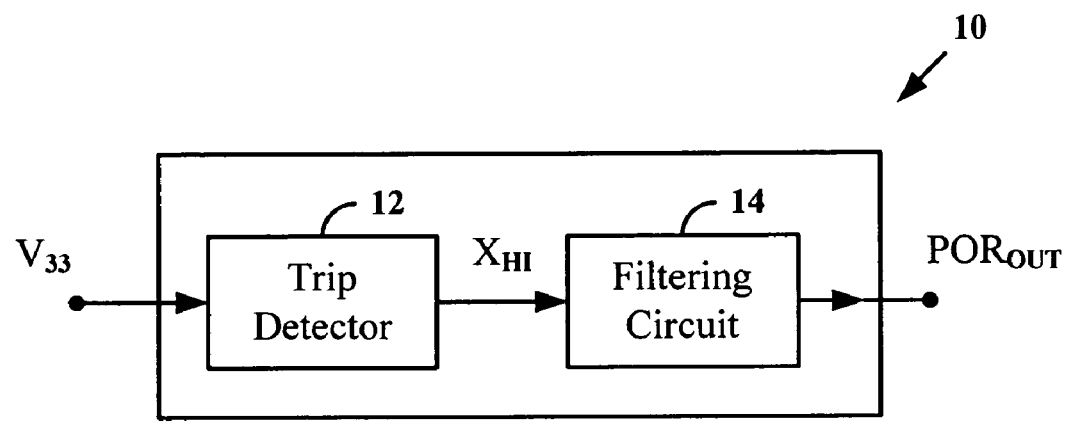
FIG. 1 is a diagram of a previously known power-on reset circuit.
Figure 2:
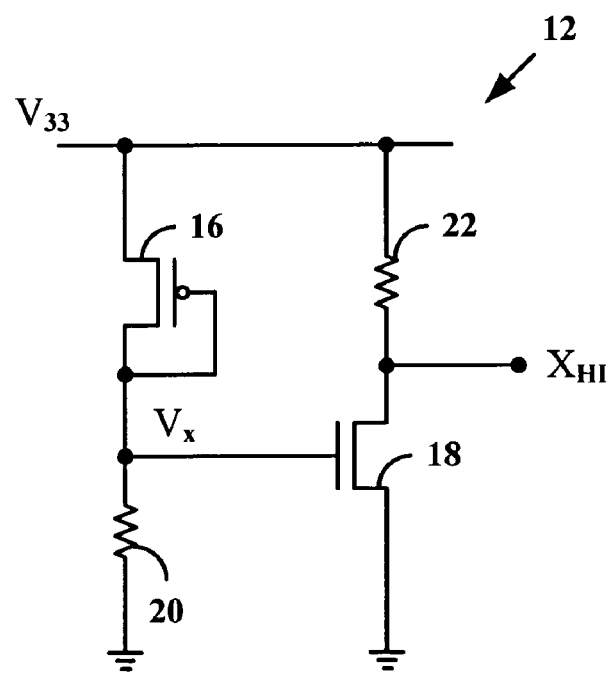
FIG. 2 is diagram of a previously known trip detector circuit.
Figure 3:
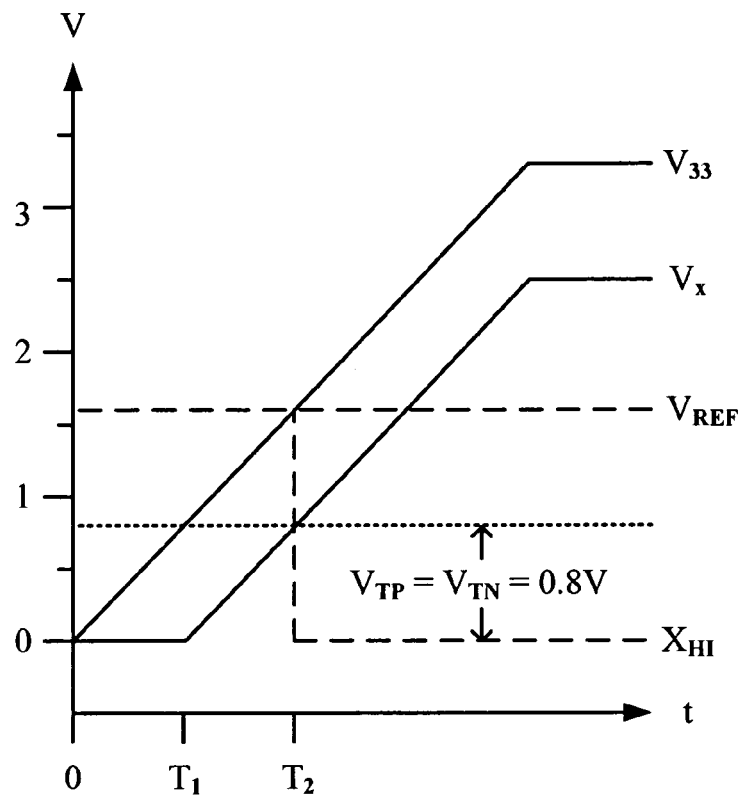
FIG. 3 is a diagram of signal response values of the circuit of FIG. 2.
Figure 4:
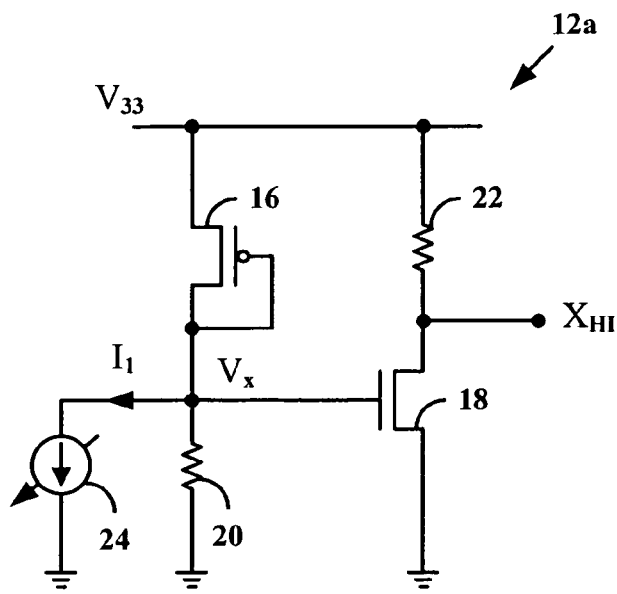
FIG. 4 is a diagram of an exemplary trip-point detector circuit in accordance with this invention.

Referring now to FIG. 4, an exemplary trip point detector circuit in accordance with this invention is described. Trip point detector circuit 12a includes the same circuit elements as trip point detector circuit 12 of FIG. 2, but also includes controlled current source 24 coupled between node $V_x$ and ground. As described in more detail below, controlled current source 24 conducts a current $I_1$ that varies based on process and temperature conditions. The following table illustrates an exemplary output response of controlled current source 24 as a function of process and temperature conditions:

TABLE 1

| Process/Temperature | $I_1$ |
|---|---|
| slow process or low temperature | 0 |
| nominal process or nominal temperature | 0 |
| fast process or high temperature | >0 |

That is, for slow or nominal processes, or low or nominal temperature, controlled current source 24 conducts no current. As a result, controlled current source 24 is effectively disconnected from node $V_x$, and trip point detector circuit 12a behaves like previously known trip point detector circuit 12 of FIG. 2. In contrast, for fast processes or high temperature, controlled current source 24 conducts current $I_1>0$, and effectively increases trip point reference signal $V_{REF}$.

Figure 5:
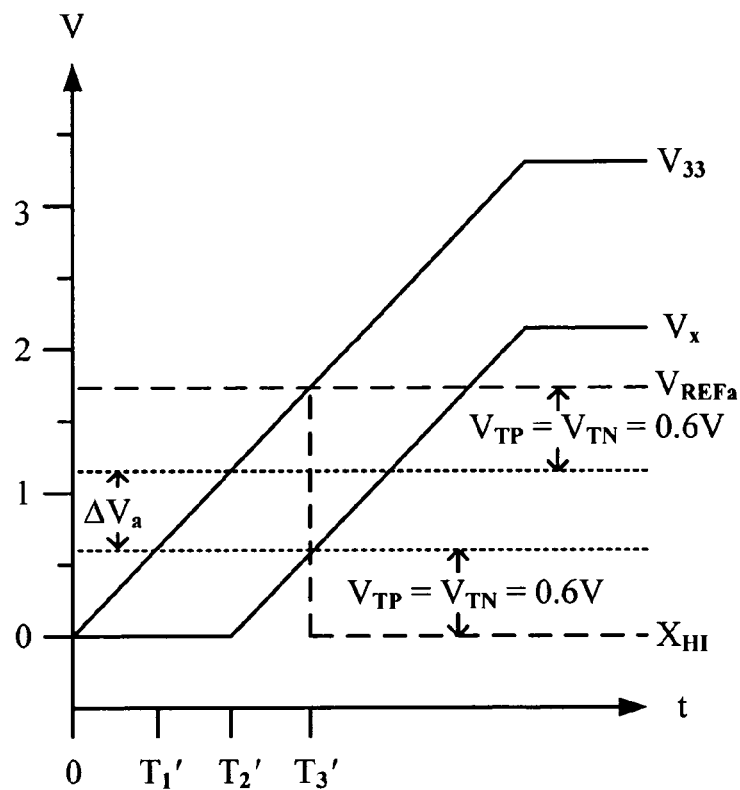
FIG. 5 is a diagram of signal response values of the circuit of FIG. 4.

Referring now to FIGS. 4 and 5, the operation of trip detector circuit 12a is described for fast processes or high temperature conditions that result in low threshold voltages (e.g., $V_{TN}=0.6V$ or $V_{TP}=0.6V$). Persons of ordinary skill in the art will understand that threshold voltages $V_{TN}$ and $V_{TP}$ may not necessarily have equal values, and that methods and apparatus in accordance with this invention do not require that the two threshold voltages be equal. At t=0, $V_{33}$=0V, transistor 16 is OFF, and no current flows through resistor 20. As a result (assuming $V_x$ cannot go below ground), $V_x$=0V, transistor 18 is OFF, no current flows through resistor 22, and $X_{HI}$=$V_{33}$=0V. For 0≤t<$T_1$', $V_{33}$ increases, but remains below $V_{TP}$. As a result, transistor 16 remains OFF, and $V_x$=0. At t=$T_1$', $V_{33}$ exceeds $V_x$ by the threshold voltage $V_{TP}$, and transistor 16 begins to conduct. Because resistor 20 is large, transistor 16 tries to supply almost all of current $I_1$ required by controlled current source 24. As a result, $V_x$ remains at ground.

For $T_1$'≤t<$T_2$', $V_{33}$ increases, but $V_x$ remains at ground as transistor 16 continues to try to supply current $I_1$. At t=$T_2$', transistor 16 is fully saturated, which occurs at a $V_{33}$ value of:

$$V_{33} = |V_{GS}| = V_{TP} + \Delta V_a \quad (1)$$

where $\Delta V_a$ is given by:

$$\Delta V_a = \sqrt{\frac{2I_1}{\beta_{16}}} \quad (2)$$

$$\beta_{16} = \left(\frac{W}{L}\right)_{16} \frac{\mu C_{ox}}{2} \quad (3)$$

where $$\left(\frac{W}{L}\right)_{16}$$

is the ratio of the width to length of transistor 16, $\mu$ is a constant and $C_{ox}$ is a process parameter.

For $T_2$'≤t<$T_3$', $V_x$ continues to track $V_{33}$, but remains below the threshold voltage $V_{TN}$ of transistor 18. Accordingly, transistor 18 remains OFF, and $X_{HI}$=$V_{33}$. At t=$T_3$', when $V_x$ equals $V_{TN}$, transistor 18 turns ON, and pulls $X_{HI}$ to ground. In this example, $X_{HI}$ changes from a positive non-zero voltage to 0V when $V_{33}$ exceeds trip-point reference signal $V_{REFa}$=$V_{TP}$+$V_{TN}$+$\Delta V_a$. Thus, trip point detector circuit 12a has a trip-point reference signal $V_{REFa}$ that adapts to process and temperature conditions, as indicated in the following table:

TABLE 2

| Process/Temperature | $V_{REFa}$ |
|---|---|
| slow process or low temperature | $V_{TP}$ + $V_{TN}$ |
| nominal process or nominal temperature | $V_{TP}$ + $V_{TN}$ |
| fast process or high temperature | $V_{TP}$ + $V_{TN}$ + $\Delta V_a$ |

For nominal or slow processes or nominal or low temperature conditions (i.e., when threshold voltages $V_{TN}$ and $V_{TP}$ are nominal or high), trip-point reference signal $V_{REFa}$ equals the sum of threshold voltages $V_{TN}$ and $V_{TP}$. However, for fast processes or high temperature conditions (i.e., when threshold voltages $V_{TN}$ and $V_{TP}$ are low), trip-point reference signal $V_{REFa}$ equals the sum $V_{TN}$+$V_{TP}$+$\Delta V_a$.

Figure 6:
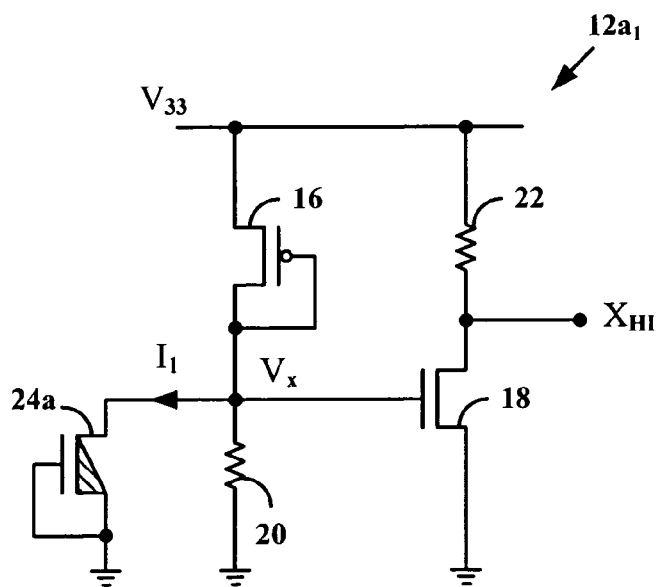
FIG. 6 is a diagram of an exemplary implementation of the circuit of FIG. 4.

Controlled current source 24 may be implemented using any circuit that has an output current that varies with process and temperature as shown in Table 1. Referring now to FIG. 6, an exemplary embodiment of such a circuit is described. In particular, trip point detector circuit 12a₁ includes native n-channel transistor 24a having its drain terminal coupled to node $V_x$, and its gate and source terminals coupled to ground. Native n-channel transistor 24a, sometimes referred to as a depletion-mode transistor, has a threshold voltage $V_{TZ}$ having a nominal value of approximately 0V. If native n-channel transistor 24a is fabricated on the same die as n-channel transistor 18, the threshold voltage of both transistors often will track with temperature conditions and n-channel process conditions, as illustrated in the following table:

TABLE 3

| N-Process/Temperature | $V_{TN}$ | $V_{TZ}$ |
|---|---|---|
| slow process or low temperature | high | high |
| nominal process or nominal temperature | nominal | nominal |
| fast process or high temperature | low | low |

Thus, if $V_{TZ}$ has a nominal value of 0V, for nominal or low temperatures, or slow or nominal n-processes, native n-channel transistor 24a never turns ON because the transistor's gate-to-source voltage $V_{GS}$=0. Under such conditions, trip point detector circuit 12a₁ behaves like trip point detector circuit 12 of FIG. 2. However, for fast n-processes or high temperatures, $V_{TZ}$ is less than 0V, and native n-channel transistor 24a turns ON when $V_x$ is above 0V. Thus, native n-channel transistor 24a acts like a controlled current source whose current varies with n-process and temperature conditions, as in Table 1, above. As a result, trip point detector circuit 12a₁ has a trip-point reference signal $V_{REFa}$ that adapts to process and temperature conditions, as in Table 2, above. Persons of ordinary skill in the art will understand that trip point detector circuit 12a₁ alternatively may be configured to have a trip-point reference signal $V_{REFa}$ that adapts to p-process and temperature conditions.

Figure 7:
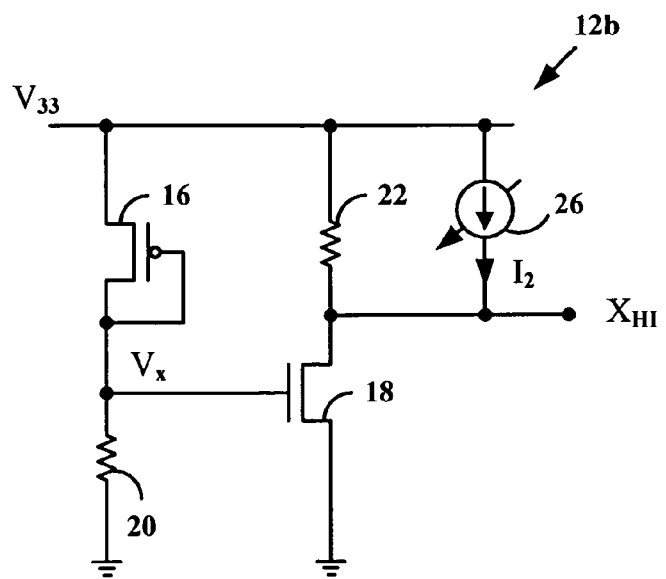
FIG. 7 is a diagram of an alternative exemplary trip-point detector circuit in accordance with this invention.

Referring now to FIG. 7, an alternative exemplary trip point detector circuit in accordance with this invention is described. Trip point detector circuit 12b includes the same circuit elements as trip point detector circuit 12 of FIG. 2, but also includes controlled current source 26 coupled between $V_{33}$ and node $X_{HI}$. As described in more detail below, controlled current source 26 conducts a current $I_2$ that varies based on process and temperature conditions. The following table illustrates an exemplary output response of controlled current source 26 as a function of process and temperature conditions:

TABLE 4

| Process/Temperature | $I_2$ |
|---|---|
| slow process or low temperature | 0 |
| nominal process or nominal temperature | 0 |
| fast process or high temperature | >0 |

That is, for slow or nominal processes, or low or nominal temperature, controlled current source 26 conducts no current. As a result, controlled current source 26 is effectively disconnected from node $X_{HI}$, and trip point detector circuit 12b operates like previously known trip point detector circuit 12 of FIG. 2. In contrast, for fast processes or high temperature, controlled current source 26 conducts current $I_2$>0, and effectively increases trip point reference signal $V_{REF}$.

Figure 8:
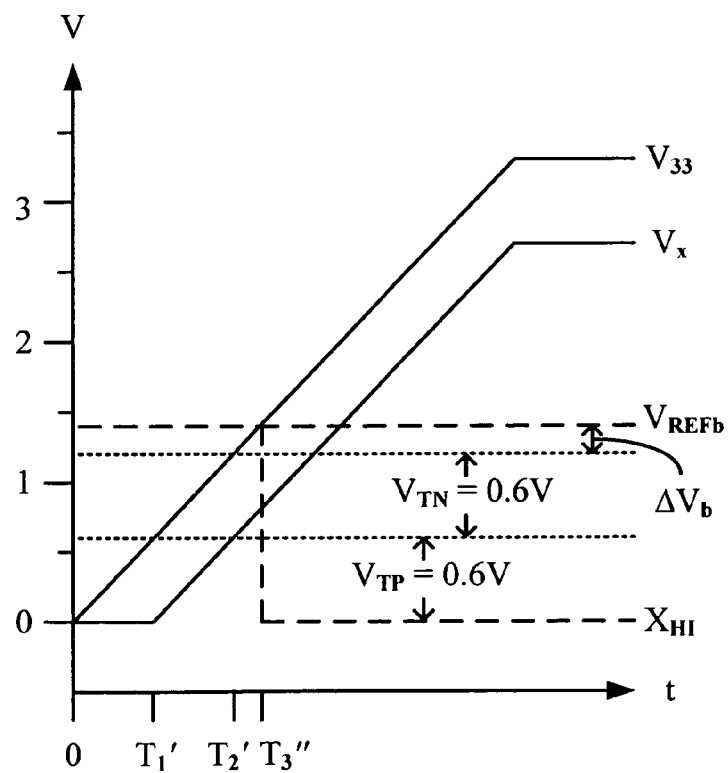
FIG. 8 is a diagram of signal response values of the circuit of FIG. 7.

Referring now to FIGS. 7 and 8, the operation of trip detector circuit 12b is described for fast processes or high temperature conditions that result in low threshold voltages (e.g., $V_{TN}$=0.6V or $V_{TP}$=0.6V). At t=0, $V_{33}$=0V, transistor 16 is OFF, $V_x$=0V, transistor 18 is OFF, and $X_{HI}$ equals $V_{33}$=0V. For 0≦t<$T_1$', $V_{33}$ increases, but remains below $V_{TP}$. As a result, transistor 16 remains OFF, $V_x$=0, and $X_{HI}$=$V_{33}$. At t=$T_1$', $V_{33}$ exceeds $V_x$ by the threshold voltage $V_{TP}$, and transistor 16 therefore begins to conduct.

For $T_1$'≦t<$T_2$', $V_X$ remains one $V_{TP}$ below $V_{33}$. Because $V_X$ is less than $V_{TN}$, transistor 18 remains OFF, and $X_{HI}$=$V_{33}$. At t=$T_2$', $V_{33}$=$V_{TP}$+$V_{TN}$, $V_x$=$V_{TN}$, and transistor 18 begins to conduct. However, a higher gate-to-source voltage is required to turn ON transistor 18 and sink the current $I_2$ from controlled current source 26. As a result, $X_{HI}$=$V_{33}$. At t=$T_3$", transistor 18 is fully saturated, and pulls $X_{HI}$ to ground. This occurs when $V_{33}$ has a value of:

$$V_{33}=V_{TP}+V_{GS18}=V_{TP}+(V_{TN}+\Delta V_b) \quad (4)$$

where $\Delta V_b$ is given by:

$$\Delta V_b = \sqrt{\frac{2I_2}{\beta_{18}}} \quad (5)$$

$$\beta_{18} = \left(\frac{W}{L}\right)_{18} \frac{\mu C_{ox}}{2} \quad (6)$$

where $$\left(\frac{W}{L}\right)_{18}$$

is the ratio of the width to length of transistor 18, μ is a constant and $C_{ox}$ is a process parameter. In this example, $X_{HI}$ changes from a positive non-zero voltage to 0V when $V_{33}$ exceeds trip-point reference signal $V_{REFb}$=$V_{TP}$+$V_{TN}$+$\Delta V_b$.

Thus, trip point detector circuit 12b has a trip-point reference signal $V_{REFb}$ that adapts to process and temperature conditions, as indicated in the following table:

TABLE 5

| Process/Temperature | $V_{REFb}$ |
| --- | --- |
| slow process or low temperature | $V_{TP}$ + $V_{TN}$ |
| nominal process or nominal temperature | $V_{TP}$ + $V_{TN}$ |
| fast process or high temperature | $V_{TP}$ + $V_{TN}$ + $\Delta V_b$ |

For nominal or slow processes or nominal or low temperature conditions (i.e., when threshold voltages $V_{TN}$ and $V_{TP}$ are nominal or high), trip-point reference signal $V_{REFb}$ equals the sum of threshold voltages $V_{TN}$ and $V_{TP}$. However, for fast processes or high temperature conditions (i.e., when threshold voltages $V_{TN}$ and $V_{TP}$ are low), trip-point reference signal $V_{REFb}$ equals the sum $V_{TN}$+$V_{TP}$+$\Delta V_b$.

Figure 9:
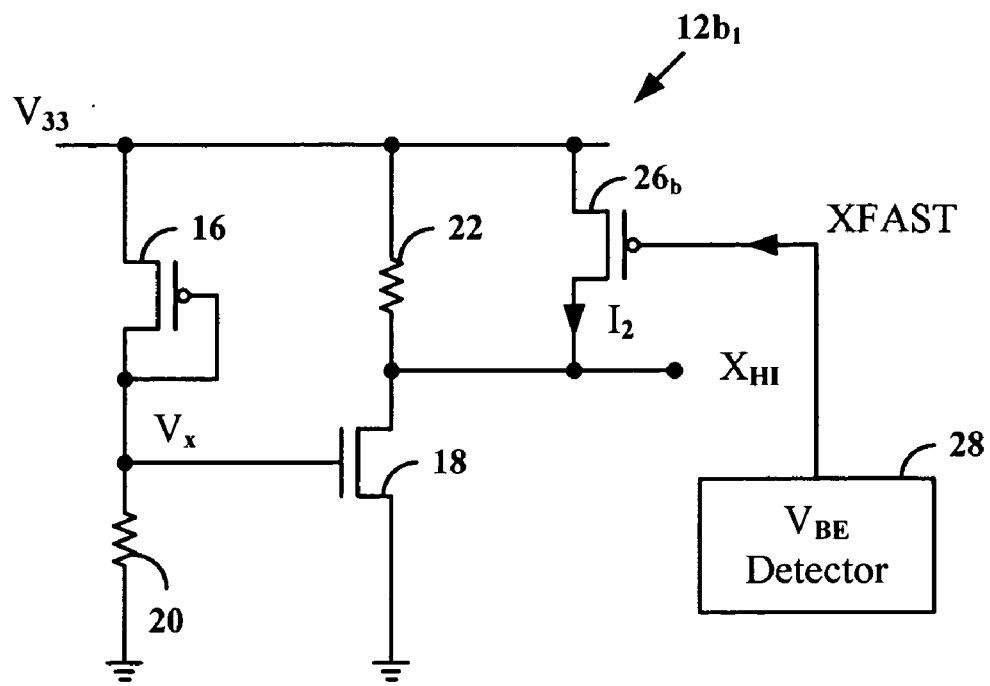
FIG. 9 is a diagram of an exemplary implementation of the circuit of FIG. 7.

Controlled current source 26 may be implemented using any circuit that has an output response as shown in Table 4. Referring now to FIG. 9, an exemplary embodiment of such a circuit is described. Trip point detector circuit 12b₁ includes p-channel transistor 26b having its drain terminal coupled to node $X_{HI}$, its gate terminal coupled to signal $X_{FAST}$, and its source terminal coupled to node $V_{33}$. As described in more detail below, $V_{BE}$ detector circuit 28 provides signal $X_{FAST}$ whose value depends on process and temperature conditions. In particular, for nominal or slow processes, or nominal or low temperatures, $X_{FAST}$ is HIGH, and transistor 26b is OFF. Under such conditions, trip point detector circuit 12b₁ behaves like trip point detector circuit 12 of FIG. 2. In contrast, for fast processes or high temperatures, $X_{FAST}$ is LOW, and transistor 26b injects current into node $X_{HI}$. Thus, transistor 26b acts like a controlled current source whose current varies with process and temperature conditions, as in Table 1, above. As a result, trip point detector circuit 12b₁ has a trip-point reference signal $V_{REFb}$ that adapts to process and temperature conditions, as in Table 4, above.

Figure 10:
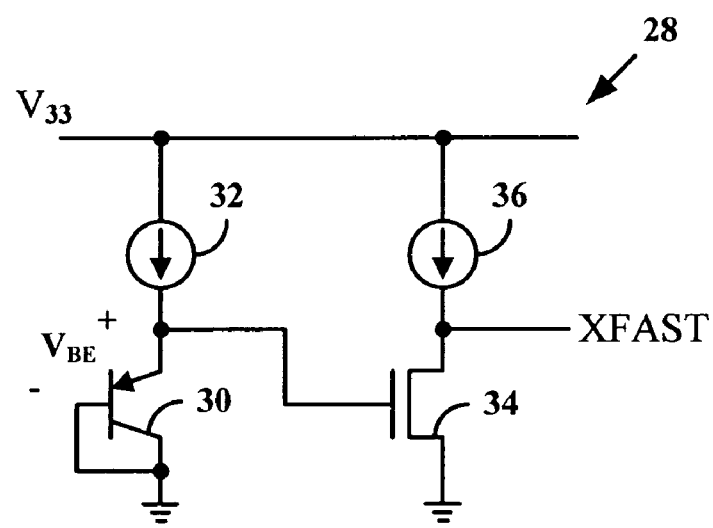
FIG. 10 is a diagram of an exemplary $V_{BE}$ detector circuit of FIG. 9.

Referring now to FIG. 10, an exemplary $V_{BE}$ detector circuit is described for generating $X_{FAST}$. In particular, $V_{BE}$ detector circuit 28 includes PNP transistor 30 having its base and collector terminals coupled to ground, and its emitter terminal coupled to $V_{33}$ via current source 32. The emitter terminal of PNP transistor 30 is also coupled to the gate of n-channel transistor 34, which has its source coupled to ground, and its drain terminal (node $X_{FAST}$) coupled to $V_{33}$ via current source 36. Thus, the base-emitter voltage of PNP transistor 30 equals the gate-source voltage of n-channel transistor 34.

The base-emitter voltage $V_{BE}$ of PNP transistor 30 and the threshold voltage $V_{TN}$ of n-channel transistor 34 tend to shift in the same direction with variations in n-process and temperature. However, variations in $V_{BE}$ typically are much less than variations in $V_{TN}$, and $V_{BE}$ typically remains very close to 0.7V. Thus, if $V_{TN}$ has a nominal value of 0.8V, for nominal or slow n-processes and nominal or low temperatures, $V_{BE}$ is less than $V_{TN}$. In contrast, for fast n-processes or high temperatures, $V_{BE}$ is greater than $V_{TN}$. Thus, for nominal or slow n-processes and nominal or low temperatures, the $V_{BE}$ of PNP transistor 30 is less than $V_{TN}$, transistor 34 is OFF, and $X_{FAST}$ is HIGH. In contrast, for fast n-processes or high temperatures, the $V_{BE}$ of PNP transistor 30 is greater than $V_{TN}$, transistor 34 is ON, and $X_{FAST}$ is LOW. Persons of ordinary skill in the art will understand that if $V_{TN}$ has a nominal value other than 0.8V, $V_{BE}$ may be compared to a scaled version of $V_{TN}$ to generate $X_{FAST}$. Persons of ordinary skill in the art will understand that $V_{BE}$ detector circuit 28 alternatively may be configured to provide a signal $X_{FAST}$ that varies based on p-process and temperature conditions.

Figure 11:
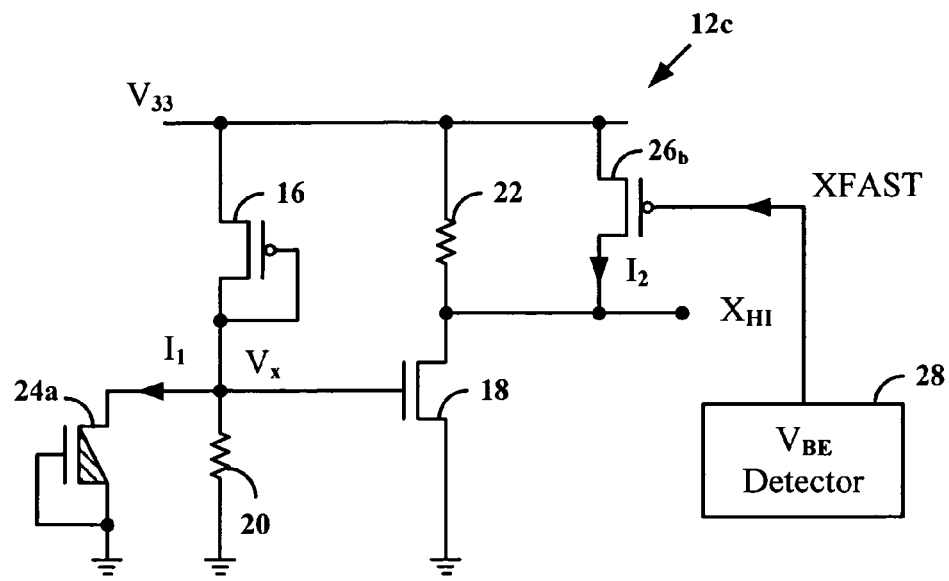
FIG. 11 is a diagram of another alternative exemplary trip-point detector circuit in accordance with this invention.
Figure 12:
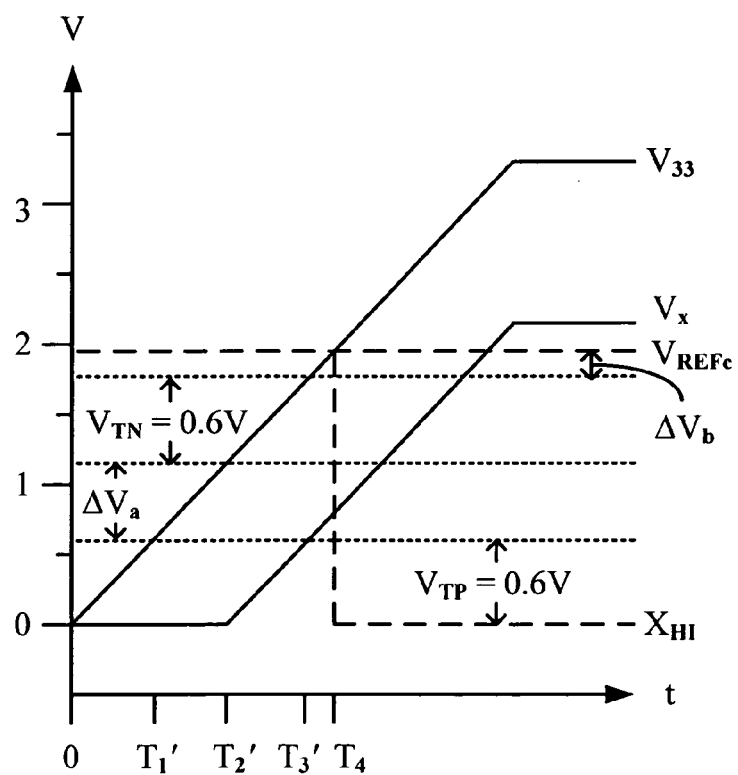
FIG. 12 is a diagram of signal response values of the circuit of FIG. 11.

Referring now to FIG. 11, another exemplary trip point detector circuit in accordance with this invention is described. In this example, the techniques illustrated in exemplary trip detector circuits 12a₁ and 12b₁ are combined. In particular, trip detector circuit 12c includes native n-channel transistor 24 coupled between node $V_x$ and ground, and p-channel transistor 26b coupled between $V_{33}$ and node $X_{HI}$. FIG. 12 illustrates the response of trip detector circuit 12c for fast processes or high temperature conditions that result in low threshold voltages (e.g., $V_{TN}$=0.6V or $V_{TP}$=0.6V). Using an analysis similar to that described above, persons of ordinary skill in the art will understand that trip point detector circuit 12c has a trip-point reference signal $V_{REFc}$ that adapts to process and temperature conditions, as indicated in the following table:

TABLE 6

| Process/Temperature | $V_{REFc}$ |
| --- | --- |
| slow process or low temperature | $V_{TP}$ + $V_{TN}$ |
| nominal process or nominal temperature | $V_{TP}$ + $V_{TN}$ |
| fast process or high temperature | $V_{TP}$ + $V_{TN}$ + $\Delta V_a$ + $\Delta V_b$ | where $\Delta V_a + \Delta V_b$ have values as specified in equations (2) and (3), and (5) and (6), respectively.

Figure 13:
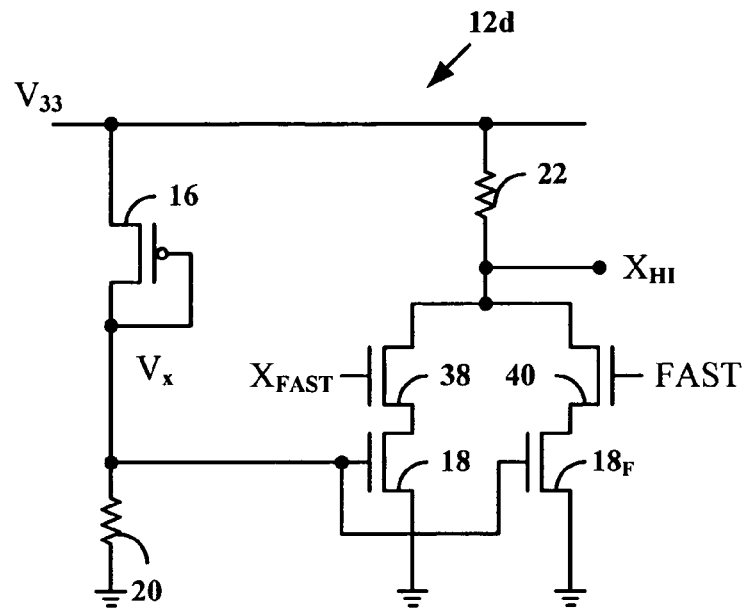
FIG. 13 is a diagram of still another alternative exemplary trip-point detector circuit in accordance with this invention.

Referring now to FIG. 13, another exemplary trip point detector circuit in accordance with this invention is described. In particular, trip point detector circuit 12d includes n-channel transistors 38 and 40 having drain terminals coupled to node $X_{HI}$, and source terminals coupled to the drain terminals of transistors 18 and 18F, respectively. In addition, transistor 38 has a gate terminal coupled to signal $X_{FAST}$, and transistor 40 has a gate terminal coupled to signal FAST (i.e., the logical inverse of $X_{FAST}$). Transistor 18F is similar to transistor 18, but has a higher nominal threshold voltage $V_{TNH}$ than the threshold voltage $V_{TN}$ of transistor 18. For example, if $V_{TN}$ has a nominal threshold voltage of 0.8V, $V_{THN}$ may have a nominal value of 1.0V. The difference in threshold values may be achieved, for example, by adjusting the dimensions of transistor 18F relative to the dimensions of transistor 18, or by adjusting the processing steps that affect the threshold voltages of the two transistors.

Transistors 38 and 40 are sized to operate as switches that alternately switch transistors 18 or 18F in or out of the circuit based on process and temperature conditions. In particular, for nominal or slow processes, or nominal or low temperatures, $X_{FAST}$ is HIGH, FAST is LOW, the drain of transistor 18 is coupled to node $X_{HI}$, and transistor 18F is effectively disconnected from the rest of the circuit. Under such conditions, trip point detector circuit 12d behaves like trip point detector circuit 12 of FIG. 2. In contrast, for fast processes or high temperatures, $X_{FAST}$ is LOW, FAST is HIGH, the drain of transistor 18F is coupled to node $X_{HI}$, and transistor 18 is effectively disconnected from the rest of the circuit. Thus, for fast processes or high temperatures, trip point detector circuit 12d swaps nominal threshold transistor 18 with high threshold transistor 18F.

If transistors 18 and 18F are fabricated on the same die, the threshold voltage of both transistors often will track with process and temperature conditions, an example of which is illustrated in the following table:

TABLE 7

| N-Process/Temperature | $V_{TN}$ | $V_{TNH}$ |
|---|---|---|
| slow process or low temperature | 1.0 | 1.2 |
| nominal process or nominal temperature | 0.8 | 1.0 |
| fast process or high temperature | 0.6 | 0.8 |

Figure 14:
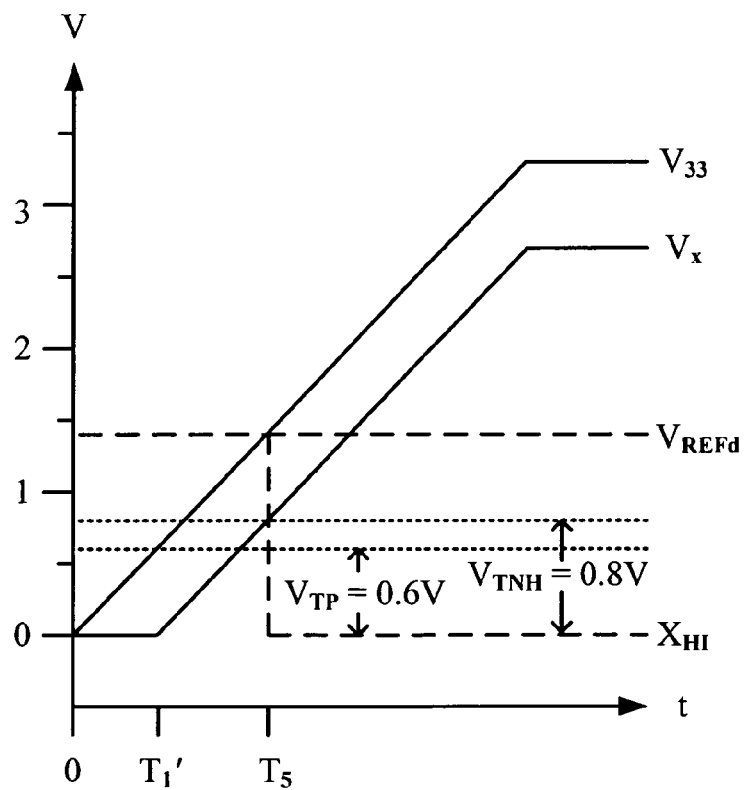
FIG. 14 is a diagram of signal response values of the circuit of FIG. 13.

Referring now to FIGS. 13 and 14, the operation of trip point detector circuit 12d is described for fast processes or high temperature conditions that result in low threshold voltages. In this example, $V_{TN} = V_{TP} = 0.6V$, $V_{TNH} = 0.8V$, $X_{FAST}$ is LOW, and FAST is HIGH. As a result, transistor 18 is effectively switched out of the circuit, and transistor 18F is effectively switched into the circuit. At t=0, $V_{33}=0V$, transistor 16 is OFF, $V_x=0V$, transistor 18F is OFF, and $X_{HI}$ equals $V_{33}=0V$. For $0 \leq t < T_1'$, $V_{33}$ increases, but remains below $V_{TP}$. As a result, transistor 16 remains OFF, $V_x=0$, and $X_{HI}=V_{33}$. At $t=T_1'$, $V_{33}$ exceeds $V_x$ by the threshold voltage $V_{TP}$, and transistor 16 therefore begins to conduct. For $T_1' \leq t < T_5$, $V_x$ remains one $V_{TP}$ below $V_{33}$. Because $V_x$ is less than $V_{TNH}$, transistor 18F remains OFF, and $X_{HI}=V_{33}$. At $t=T_5$, $V_{33}=V_{TP}+V_{TNH}$, $V_x=V_{TNH}$, and transistor 18F turns ON and pulls $X_{HI}$ to ground. In this example, $X_{HI}$ changes from a positive non-zero voltage to 0V when $V_{33}$ exceeds trip-point reference signal $V_{REFd}=V_{TP}+V_{TNH}$.

The exemplary circuits described above illustrate techniques used to increase the trip point reference $V_{REF}$ when transistor threshold voltages are lowered as a result of process or temperature conditions. Persons of ordinary skill in the art will understand that methods and apparatus in accordance with this invention also may be used to decrease the trip point reference $V_{REF}$ when transistor threshold voltages are raised as a result of process or temperature conditions. For example, in trip point detector circuit $12_{b1}$ illustrated in FIG. 9, the gate of p-channel transistor $26_b$ may be coupled to a control signal SLOW that is LOW for nominal or fast processes, or nominal or high temperatures, and HIGH for slow processes or low temperature conditions. In that regard, current $I_2$ would be injected into the drain of transistor 18 except if process or temperature conditions tended to increase threshold voltages $V_{TP}$ and $V_{TN}$. Under such circumstance, $I_2$ would turn OFF, which would decrease the trip point reference $V_{REF}$.

Alternatively, in trip point detector circuit $12_d$ illustrated in FIG. 13, the gate terminals of transistors 38 and 40 may be coupled to $X_{SLOW}$ (i.e., the logical inverse of SLOW) and SLOW, respectively, and transistor 18F may be fabricated to have a lower nominal threshold voltage $V_{TNL}$ than the threshold voltage $V_{TN}$ of transistor 18. Thus, for nominal or fast processes, or nominal or high temperatures, $X_{SLOW}$ is HIGH, SLOW is LOW, the drain of transistor 18 is coupled to node $X_{HI}$, and transistor 18F is effectively disconnected from the rest of the circuit. In contrast, for slow processes or low temperatures, $X_{SLOW}$ is LOW, SLOW is HIGH, the drain of transistor 18F is coupled to node $X_{HI}$, and transistor 18 is effectively disconnected from the rest of the circuit. Thus, for slow processes or low temperatures, trip point detector circuit 12d swaps nominal threshold transistor 18 with high threshold transistor 18F, which would decrease the trip point reference $V_{REF}$.

The foregoing merely illustrates the principles of this invention, and various modifications can be made by persons of ordinary skill in the art without departing from the scope and spirit of this invention.

The invention claimed is:

1. A trip point detector circuit that receives an input signal at an input signal node and generates an output signal at an output signal node, the output signal changing from a first value to a second value when the input signal exceeds a trip point reference value, the trip point detector circuit comprising:

a circuit element that adjusts the trip point reference value to compensate for variations in process or temperature, without requiring an externally-supplied reference signal, wherein the circuit element conducts substantially no current except under predetermined process or temperature conditions.

2. The trip point detector circuit of claim 1, wherein the circuit element operates to increase the trip point reference value.

3. The trip point detector circuit of claim 1, wherein the circuit element operates to decrease the trip point reference value.

4. The trip point detector circuit of claim 1, wherein the circuit element adjusts the trip point reference value based on a value of a transistor threshold voltage.

5. The trip point detector circuit of claim 1, wherein the circuit element comprises a controlled current source.

6. The trip point detector circuit of claim 5, wherein the controlled current source conducts a current that varies based on process and temperature conditions.

7. The trip point detector circuit of claim 5, wherein the controlled current source comprises a transistor.

8. The trip point detector circuit of claim 5, wherein the controlled current source comprises a depletion-mode transistor.

9. A method for adapting a trip point reference value of a trip point detector circuit that receives an input signal at an input signal node and generates an output signal at an output signal node, the output signal changing from a first value to a second value when the input signal exceeds the trip point reference value, the method comprising:
providing a circuit element adapted to adjust the trip point reference value to compensate for variations in process or temperature, without requiring an externally-supplied reference signal, wherein the circuit element conducts substantially no current except under predetermined process or temperature conditions.

10. The method of claim 9, wherein adjusting comprises increasing the trip point reference value.

11. The method of claim 9, wherein adjusting comprises decreasing the trip point reference value.

12. The method of claim 9, wherein adjusting comprises adjusting the trip point reference value based on a value of a transistor threshold voltage.

13. The method of claim 9, wherein adjusting comprises adjusting a current in the trip detector circuit based on process and temperature conditions.

14. The method of claim 9, wherein the trip point detector circuit comprises a first transistor having a first threshold voltage, and a second transistor having a second threshold voltage, and wherein adjusting comprises switching between the first and second transistors.

15. The method of claim 14, wherein the first threshold voltage is higher than the second threshold voltage.

16. A trip point detector circuit that receives an input signal at an input signal node and generates an output signal at an output signal node, the output signal changing from a first value to a second value when the input signal exceeds a trip point reference value, the trip point detector circuit comprising:
a first transistor coupled between the input signal node and an internal node;
a second transistor coupled between the internal node and the output signal node; and
a controlled current source coupled to the internal signal node, the controlled current source adjusting the trip point reference value to compensate for variations in process or temperature, without requiring an externally-supplied reference signal, wherein the controlled current source conducts substantially no current except under predetermined process or temperature conditions.

17. The trip point detector circuit of claim 16, wherein the controlled current source comprises a transistor.

18. The trip point detector circuit of claim 16, wherein the controlled current source comprises a depletion-mode transistor.

19. A trip point detector circuit that receives an input signal at an input signal node and generates an output signal at an output signal node, the output signal changing from a first value to a second value when the input signal exceeds a trip point reference value, the trip point detector circuit comprising:
a first transistor coupled between the input signal node and an internal node;
a second transistor coupled between the internal node and the output signal node; and
a controlled current source coupled to the output signal node, the controlled current source adjusting the trip point reference value to compensate for variations in process or temperature, without requiring an externally-supplied reference signal, wherein the controlled current source is adapted to conduct substantially no current under nominal process and nominal temperature conditions, and the second transistor and controlled current source are adapted to simultaneously conduct current under predetermined process and temperature conditions.

20. The trip point detector circuit of claim 19, wherein the controlled current source comprises a transistor.

* * * * *